United States Patent
Jandhyala et al.

(10) Patent No.: US 11,010,887 B2
(45) Date of Patent: May 18, 2021

(54) AUTOMATED DISTRESS RANKING SYSTEM

(71) Applicant: GENERAL ELECTRIC COMPANY, Schenectady, NY (US)

(72) Inventors: Aswini Kumar Jandhyala, Bengaluru (IN); Rajkumar Singha Konwar, Bengaluru (IN); Ashok Kumaraswamy, Bengaluru (IN); Manibabu Pippalla, Bengaluru (IN)

(73) Assignee: General Electric Company, Schenectady, NY (US)

( * ) Notice: Subject to any disclaimer, the term of this patent is extended or adjusted under 35 U.S.C. 154(b) by 65 days.

(21) Appl. No.: 16/132,904

(22) Filed: Sep. 17, 2018

(65) Prior Publication Data
US 2020/0090315 A1    Mar. 19, 2020

(51) Int. Cl.
| | | |
|---|---|---|
| *G06K 9/00* | (2006.01) | |
| *G06T 7/00* | (2017.01) | |
| *G06K 9/62* | (2006.01) | |
| *G06F 30/20* | (2020.01) | |
| *G01N 21/88* | (2006.01) | |

(52) U.S. Cl.
CPC ............ *G06T 7/001* (2013.01); *G06K 9/6247* (2013.01); *F05B 2260/80* (2013.01); *G01N 2021/8887* (2013.01); *G06F 30/20* (2020.01); *G06T 2207/10016* (2013.01); *G06T 2207/20076* (2013.01); *G06T 2207/20212* (2013.01); *G06T 2207/30108* (2013.01)

(58) Field of Classification Search
CPC .......... G06T 7/001; G06T 2207/20212; G06T 2207/30108; G06T 2207/20076; G06T 2207/10016; G06K 9/6247; F05B 2260/80; G01N 2021/8887; G06F 17/5009
See application file for complete search history.

(56) References Cited

U.S. PATENT DOCUMENTS

| | | | |
|---|---|---|---|
| 7,010,987 B2 | 3/2006 | Antonelli et al. | |
| 7,606,409 B2* | 10/2009 | Funakoshi | G07C 3/146 |
| | | | 348/129 |
| 7,653,235 B2 | 1/2010 | Mylaraswamy et al. | |
| 8,131,107 B2 | 3/2012 | Sun et al. | |

(Continued)

FOREIGN PATENT DOCUMENTS

KR    20100034507 A    4/2010

OTHER PUBLICATIONS http://www-civ.eng.cam.ac.uk/underground/Cambridgepresen/Chaiyasam-Computer%20vision.pdf, Krisada Chaiyasarn, "Use of Computer Vision for Crack Detection", University of Cambridge, 15 pgs., Nov. 17, 2007.

(Continued)

*Primary Examiner* — Dhaval V Patel
(74) *Attorney, Agent, or Firm* — McGarry Bair PC

(57) ABSTRACT

A system for inspecting objects includes an imaging assembly, a detection module, an analysis module, and a memory. The imagining assembly can be a borescope that enters an unlit, closed conduit to inspect objects that are components of a turbine engine. Using an artificial light source to illuminate the conduit and one or more objects of the turbine engine, the borescope can obtain a video image of the one or more objects of the turbine engine. The video image can be used to determine a rank of distress for the one or more objects.

23 Claims, 6 Drawing Sheets

(56) References Cited

U.S. PATENT DOCUMENTS

| | | | |
|---|---|---|---|
| 8,744,166 | B2 | 6/2014 | Scheid et al. |
| 8,781,210 | B2 | 7/2014 | Scheid et al. |
| 8,792,705 | B2 | 7/2014 | Scheid et al. |
| 9,471,057 | B2 | 10/2016 | Scheid et al. |
| 9,747,683 | B2 | 8/2017 | Subramaniyan et al. |
| 9,939,349 | B2 | 4/2018 | Mueller et al. |
| 10,054,552 | B1* | 8/2018 | Frutuoso ............... G01M 15/00 |
| 2002/0128790 | A1 | 9/2002 | Woodmansee |
| 2004/0002275 | A1 | 1/2004 | Thakore |
| 2004/0183900 | A1 | 9/2004 | Karpen et al. |
| 2006/0018534 | A1 | 1/2006 | Nagata et al. |
| 2007/0133862 | A1 | 6/2007 | Gold et al. |
| 2011/0211940 | A1 | 9/2011 | George et al. |
| 2012/0162192 | A1* | 6/2012 | Wang ..................... F01D 11/14 |
| | | | 345/419 |
| 2013/0179356 | A1 | 7/2013 | Pawlowski et al. |
| 2015/0241309 | A1 | 8/2015 | Cheung |
| 2016/0155015 | A1 | 6/2016 | Bendall |
| 2016/0314571 | A1 | 10/2016 | Finn et al. |
| 2017/0090458 | A1* | 3/2017 | Lim ................... G05B 23/0232 |
| 2017/0108449 | A1* | 4/2017 | Wingfield .......... G01N 21/4788 |
| 2017/0337705 | A1 | 11/2017 | Bendall |
| 2018/0003060 | A1 | 1/2018 | Lipkin et al. |
| 2018/0033129 | A1 | 2/2018 | Finn et al. |
| 2018/0080881 | A1* | 3/2018 | Abraham ............... G06T 7/0004 |
| 2018/0173213 | A1 | 6/2018 | Bendert et al. |
| 2018/0211336 | A1 | 7/2018 | Schwarz et al. |
| 2019/0339165 | A1* | 11/2019 | Finn ........................ G06T 7/001 |
| 2019/0342499 | A1* | 11/2019 | Xiong .................. G01B 11/005 |

OTHER PUBLICATIONS

Huiyi Zhang, "Reducing Uncertainty in Wind Turbine Blade Health Inspection with Image Processing Techniques", Iowa State University, Ames, Iowa, 102 pgs., 2016.

Liuliu Wu, "Applications of Computer Vision Technologies of Automated Crack Detection and Quantification for the Inspection of Civil Infrastructure Systems", University of Central Florida, Orlando, Florida, 237 pgs., Spring Term 2015.

European Patent Office, Extended European Search Report re Application No. 19197733.9-1001, Feb. 6, 2020, 7 pages, Munich, Germany.

Intellectual Property Office of Singapore, Written Opinion re Corresponding Application No. 10201908132P, dated Aug. 29, 2002, 6 pages, Singapore.

* cited by examiner

AUTOMATED DISTRESS RANKING SYSTEM

BACKGROUND

Turbine engines, and particularly gas or combustion turbine engines, are rotary engines that extract energy from a flow of pressurized combusted gases passing through the engine onto a multitude of rotating turbine blades.

Imaging assemblies, such as a borescope, are often used to inspect internal components of assembled turbine engines, such as airfoils or disks in a gas or combustion turbine engine, in order to monitor any signs of distress or wear in the components, often without having to disassemble all or a portion of the turbine engine. The images generated can be viewed in real time by an operator or captured in digital form for later use. It can be beneficial to gather as much data as possible during inspection of the turbine engine component to maximize safety and efficiency.

BRIEF DESCRIPTION

In one aspect, the disclosure relates to a system for inspecting objects including an imaging assembly for obtaining a video image of objects having a coating; a detection module configured to identify at least an identification of coating loss and any cracks in the objects in the video image; an analysis module configured to assign at least a rank of distress of the objects based on the identification of the coating loss and any cracks in the object in the video image; and a memory for storing at least the rank of distress for each object in the video image.

In another aspect, the disclosure relates to a system for inspecting engine components of a turbine engine, the system including; at least one turbine engine component having a coated surface; an imaging assembly for obtaining a video image of the coated surface of the at least one turbine engine component; a detection module configured to identify at least an identification of coating loss and any cracks in the at least one turbine engine component in the video image; an analysis module configured to assign at least a rank of distress of the at least one turbine engine component based on the identification of the coating loss and any cracks in the at least one turbine engine component in the video image; and a memory for storing at least the rank of distress for the at least one turbine engine component in the video image.

In yet another aspect, the disclosure relates to a method for inspecting a coated object contained within a cavity, the method including: capturing a video image of the coated object in the cavity; identifying coating loss and any cracks of the coated object in the captured video image; assigning a rank of distress of the coated object based on the identified coating loss and any cracks in the video image; and storing the rank of distress for coated in the video image.

DETAILED DESCRIPTION

Figure 1:
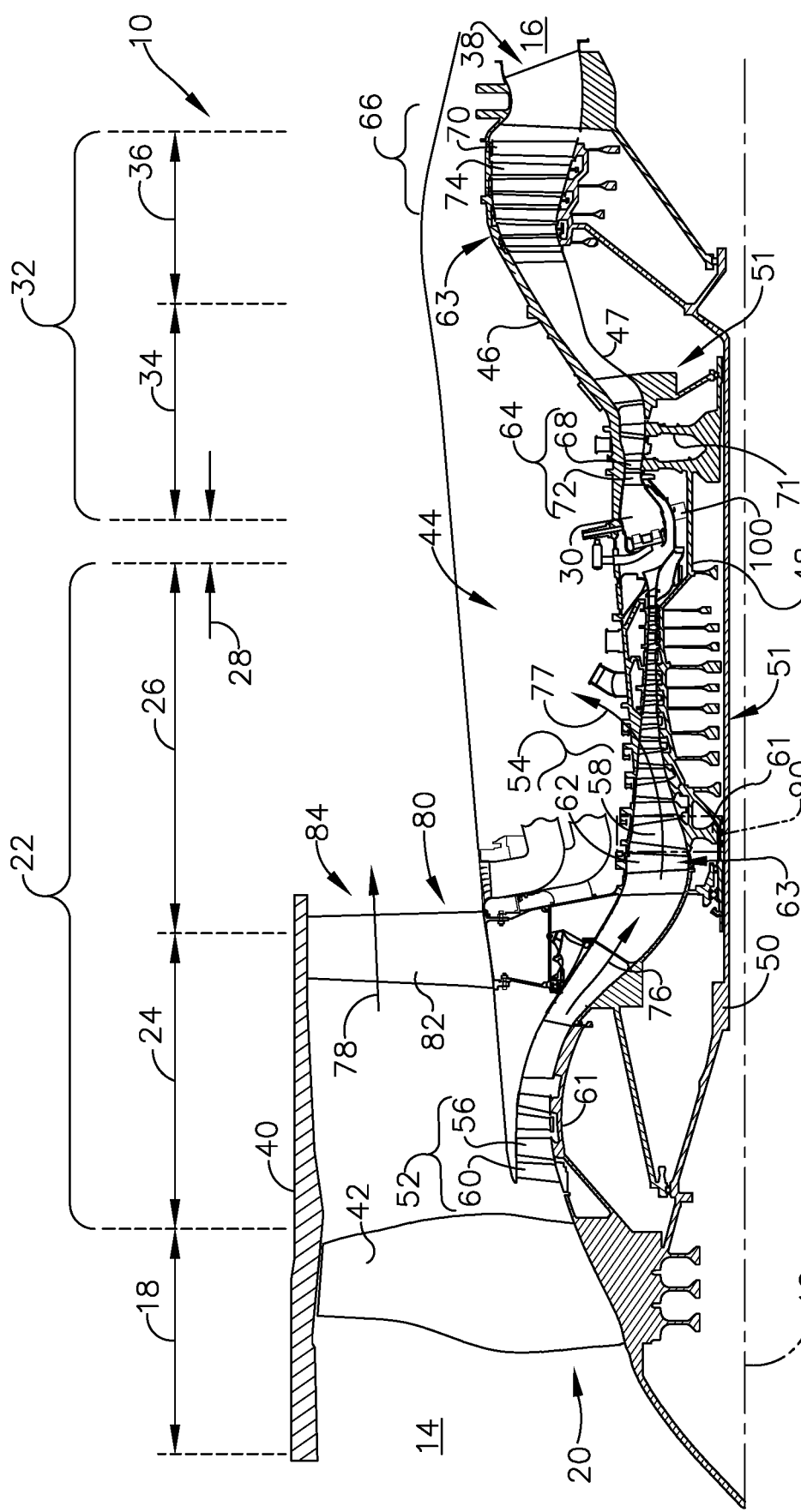
FIG. 1 is a schematic cross-sectional diagram of a turbine engine for an aircraft.

The present disclosure includes a system and a method for inspecting components of a turbine engine. Turbine engine components can be a blade, a vein, a combustor, a shroud, or any other suitable engine component where detection of coating loss or cracks is useful.

The system can include using a borescope as an imaging assembly. It will be understood, however, that the disclosure is not so limited and may have general applicability within an engine or any other suitable component where imaging inspection is desirable, as well as in non-aircraft applications, such as other mobile and non-mobile industrial, commercial, and residential applications. It is further understood that the imaging assembly can include any number of optical, mechanical, structural, or electrical components capable of obtaining a video image of the objects to be inspected.

Aircraft engine inspections are often performed while the engine remains mounted to the aircraft, and thus borescopes can contain flexible guides to allow for observation of engine components hidden from an outside observer's line of sight.

While "a set of" various elements will be described, it will be understood that "a set" can include any number of the respective elements, including only one element. All directional references (e.g., radial, axial, proximal, distal, upper, lower, upward, downward, left, right, lateral, front, back, top, bottom, above, below, vertical, horizontal, clockwise, counterclockwise, upstream, downstream, forward, aft, etc.) are only used for identification purposes to aid the reader's understanding of the present disclosure, and do not create limitations, particularly as to the position, orientation, or use of aspects of the disclosure described herein. Connection references (e.g., attached, coupled, connected, secured, fastened, and joined) are to be construed broadly and can include intermediate members between a collection of elements and relative movement between elements unless otherwise indicated. As such, connection references do not necessarily infer that two elements are directly connected and in fixed relation to one another. The exemplary drawings are for purposes of illustration only and the dimensions, positions, order and relative sizes reflected in the drawings attached hereto can vary.

FIG. 1 is a schematic cross-sectional diagram of a gas turbine engine 10 for an aircraft. The engine 10 has a generally longitudinally extending axis or centerline 12 extending forward 14 to aft 16. The engine 10 includes, in downstream serial flow relationship, a fan section 18 including a fan 20, a compressor section 22 including a booster or low pressure (LP) compressor 24 and a high pressure (HP) compressor 26, a combustion section 28 including a combustor 30, a turbine section 32 including a HP turbine 34, and a LP turbine 36, and an exhaust section 38.

The fan section 18 includes a fan casing 40 surrounding the fan 20. The fan 20 includes a plurality of fan blades 42 disposed radially about the centerline 12. The HP compressor 26, the combustor 30, and the HP turbine 34 form an engine core 44 of the engine 10, which generates combustion gases. The engine core 44 is surrounded by core casing 46, which can be coupled with the fan casing 40.

A HP shaft or spool 48 disposed coaxially about the centerline 12 of the engine 10 drivingly connects the HP turbine 34 to the HP compressor 26. A LP shaft or spool 50, which is disposed coaxially about the centerline 12 of the engine 10 within the larger diameter annular HP spool 48, drivingly connects the LP turbine 36 to the LP compressor 24 and fan 20. The spools 48, 50 are rotatable about the engine centerline and couple to a plurality of rotatable elements, which can collectively define a rotor 51.

The LP compressor 24 and the HP compressor 26 respectively include a plurality of compressor stages 52, 54, in which a set of compressor blades 56, 58 rotate relative to a corresponding set of static compressor vanes 60, 62 to compress or pressurize the stream of fluid passing through the stage. In a single compressor stage 52, 54, multiple compressor blades 56, 58 can be provided in a ring and can extend radially outwardly relative to the centerline 12, from a blade platform to a blade tip, while the corresponding static compressor vanes 60, 62 are positioned upstream of and adjacent to the rotating blades 56, 58. It is noted that the number of blades, vanes, and compressor stages shown in FIG. 1 were selected for illustrative purposes only, and that other numbers are possible.

The blades 56, 58 for a stage of the compressor can be mounted to a disk 61, which is mounted to the corresponding one of the HP and LP spools 48, 50, with each stage having its own disk 61. The blades 56, 58 can be metallurgically bonded to the disk 61 to form a monolithic structure of a blisk 90, an example location and structure as indicated in FIG. 1. The blisk 90 can be one piece when manufactured. The vanes 60, 62 for a stage of the compressor can be mounted to the core casing 46 in a circumferential arrangement.

The HP turbine 34 and the LP turbine 36 respectively include a plurality of turbine stages 64, 66, in which a set of turbine blades 68, 70 are rotated relative to a corresponding set of static turbine vanes 72, 74 (also called a nozzle) to extract energy from the stream of fluid passing through the stage. In a single turbine stage 64, 66, multiple turbine blades 68, 70 can be provided in a ring and can extend radially outwardly relative to the centerline 12 while the corresponding static turbine vanes 72, 74 are positioned upstream of and adjacent to the rotating blades 68, 70. It is noted that the number of blades, vanes, and turbine stages shown in FIG. 1 were selected for illustrative purposes only, and that other numbers are possible.

The blades 68, 70 for a stage of the turbine can be mounted to a disk 71, which is mounted to the corresponding one of the HP and LP spools 48, 50. The vanes 72, 74 for a stage of the compressor can be mounted to the core casing 46 in a circumferential arrangement.

Complementary to the rotor portion, the stationary portions of the engine 10, such as the static vanes 60, 62, 72, 74 among the compressor and turbine section 22, 32 are also referred to individually or collectively as a stator 63. As such, the stator 63 can refer to the combination of non-rotating elements throughout the engine 10.

In operation, the airflow exiting the fan section 18 is split such that a portion of the airflow is channeled into the LP compressor 24, which then supplies pressurized airflow 76 to the HP compressor 26, which further pressurizes the air. The pressurized airflow 76 from the HP compressor 26 is mixed with fuel in the combustor 30 and ignited, thereby generating combustion gases. Some work is extracted from these gases by the HP turbine 34, which drives the HP compressor 26. The combustion gases are discharged into the LP turbine 36, which extracts additional work to drive the LP compressor 24, and the exhaust gas is ultimately discharged from the engine 10 via the exhaust section 38. The driving of the LP turbine 36 drives the LP spool 50 to rotate the fan 20 and the LP compressor 24.

A portion of the pressurized airflow 76 can be drawn from the compressor section 22 as bleed air 77. The bleed air 77 can be drawn from the pressurized airflow 76 and provided to engine components requiring cooling. The temperature of pressurized airflow 76 entering the combustor 30 is significantly increased. As such, cooling provided by the bleed air 77 is necessary for operating of such engine components in the heightened temperature environments.

A remaining portion of the airflow 78 bypasses the LP compressor 24 and engine core 44 and exits the turbine engine 10 through a stationary vane row, and more particularly an outlet guide vane assembly 80, comprising a plurality of airfoil guide vanes 82, at the fan exhaust side 84. More specifically, a circumferential row of radially extending airfoil guide vanes 82 are utilized adjacent the fan section 18 to exert some directional control of the airflow 78.

Some of the air supplied by the fan 20 can bypass the engine core 44 and be used for cooling of portions, especially hot portions, of the engine 10, and/or used to cool or power other aspects of the aircraft. In the context of a turbine engine, the hot portions of the engine are normally downstream of the combustor 30, especially the turbine section 32, with the HP turbine 34 being the hottest portion as it is directly downstream of the combustion section 28. Other sources of cooling fluid can be, but are not limited to, fluid discharged from the LP compressor 24 or the HP compressor 26.

Figure 2:
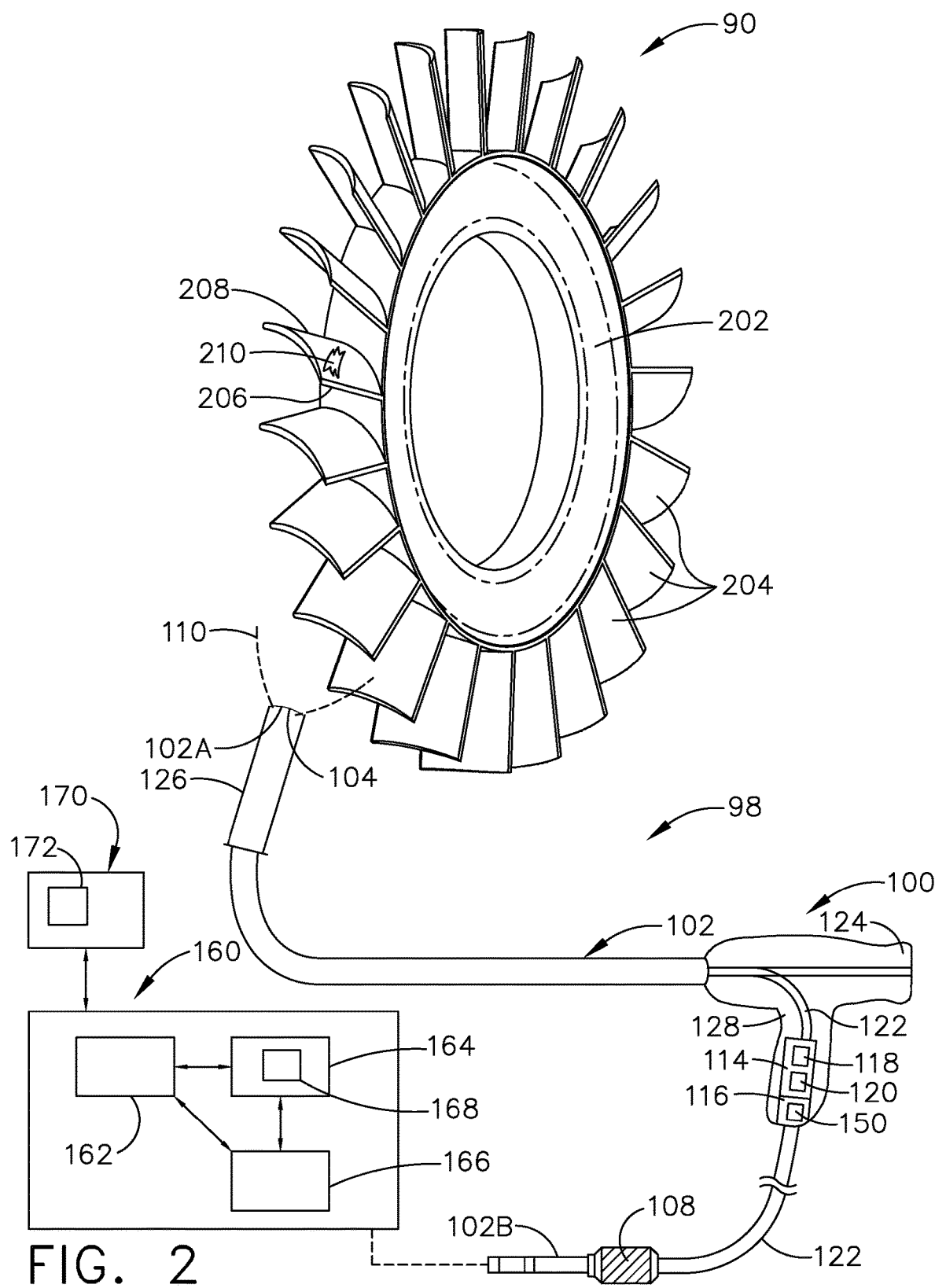
FIG. 2 schematically illustrates a system for inspecting a portion of the turbine engine of FIG. 1, with all other portions of the turbine engine removed for clarity.

FIG. 2 illustrates a system 98 for inspecting objects in the turbine engine 10 that can include an imaging assembly or borescope 100, a detection module 164, an analysis module 166, and a memory 158. The imaging assembly can include any number or combination of optical devices capable of obtaining and communicating a video image.

By way of non-limiting example, the borescope 100 is illustrated during inspection of an exemplary blisk 90 comprising a central hub 202 and a plurality of airfoil blades 204 (such as the HP compressor blades 58). The central hub 202 and the airfoil blades 204 can be formed from a single piece of metal, and the airfoil blades 204 can be metallurgically bonded to the central hub 202 such that the blisk 90 is formed and machined in one piece. The blisk 90 can be made of any operable material, such as by way of non-limiting example, titanium-based, a nickel-based, cobalt-based, or iron-based superalloy. Each part of the blisk 90, while machined in one piece, can be made from different alloys or a combination of by way of non-limiting example the aforementioned alloys. It should be understood that the blisk 90 can be in any section of the engine 10 including the fan, compressor, or turbine sections 18, 22, 32. It is also contemplated that objects inspected by the borescope can include a thermal barrier coating.

The airfoil blades 204 can comprise a leading edge 206 and a trailing edge 208, as well as a damaged portion 210; it will be understood that the damaged portion 210 is for illustrative purposes only and can be located anywhere on the airfoil blades 204. By way of non-limiting example the damaged portion 210 can include a missing part, a loss of thermal barrier coating, a curled portion of material, a broken tip, an indentation, or a fracture in the airfoil blade 204. The damaged portion 210 can occur due to debris including, but not limited to, foreign object debris in the pressurized airflow 76 or domestic object debris from particles emanating from within the engine 10. It is contemplated that the damaged portion 210 can be identified during a routine inspection of the engine 10 or a blisk 90 inspection.

The borescope 100 can include an elongated probe 102, which can be flexible, as well as a lens 104 which can be mounted at a first end 102A of the probe 102. An artificial light source 108 can provide light to a region or space 110 proximate the first end 102A and lens 104 as shown. The light source 108 can be positioned at a second end 102B of the probe 102 providing light toward the first end 102A via fiber optic cables or other light guides, or the light source 108 can be disposed at the first end 102A of the probe 102 to illuminate the region or space 110, in non-limiting examples.

The borescope 100 can be moved or threaded through a dedicated unlit, closed conduit 126, an air flow channel, or any other suitable conduit within the engine 10, where the conduit can provide access to regions including, but not limited to, the combustor 30, HP turbine 34, LP turbine 36, or blades or airfoils within the engine 10 for inspection. In such an example, it is possible for the inspection process to be performed without need for removal or disassembly of the engine 10.

The borescope 100 can include an imaging device 114. The imaging device 114 can include an imaging sensor 118 and a processor 120 capable of converting light incident on the imaging sensor 118 into an electronic signal. The imaging device 114 can be connected in data communication to the lens 104, such as via a set of fiber optic cables 122. The lens 104 can form a plurality of optical images which can be collected by the imaging device 114 to produce a video image 150. The video image 150 can include one or more two dimensional images.

The video image 150 can be stored in the memory 158 of the system 98. By way of non-limiting example, the memory 158 of the system 98 can be a scope memory 116 for further viewing or processing of the video image 150. Additionally, the video image 150 stored in the scope memory 116 can be communicated with a controller 160.

Alternatively, the video image 150 can be stored in a controller memory 162 for further viewing or processing. By way of non-limiting example, the memory 158 of the system 98 can be the controller memory 162.

The borescope 100 can communicate the video image 150 to the controller 160. Communication between the borescope and the controller 160 can be, but is not limited to, electrical signal, optical signal, sonic signal, electromagnetic signal, any other wireless signal processes, or induction. The controller 160 can include or be coupled to the detection module 164, the analysis module 166, and the controller memory 162. The detection module 164 can include a color detection capability 168. The controller 160 or the controller memory 162 can be any one or more systems of computers or modules. The detection module 164, the color detection capability 168, or the analysis module 166 can be one or more software programs or executable instructions.

The controller 160 can communicate with a user interface 170. The user interface 170 can optionally include a screen 172 for displaying the objects appearing in the video image 150 collected by or being collected by the borescope 100.

By way of non-limiting example, any computer hardware, software, language, or operating system can be used to execute, support, construct, or interface with or between the controller 160, the controller memory 162, the user interface 170, the screen 172, the modules 164, 166, or the color detection capability 168. The controller 160, the modules 164, 166, the color detection capability 168, the controller memory 162, the user interface 170, or the screen 172 can be any known computer system or combination or computer systems.

Additionally or alternatively, the borescope 100 can also include a display 124 mounted to the probe 102 and connected to the lens 104 via appropriate cabling which is capable of data transmission, such as fiber optic cables, where the video image 150 can be observed in real time through the display 124. The display 124 can be positioned in any desired location within the borescope 100, and is illustrated as mounted to a handle portion 128 of the borescope 100.

Figure 3:
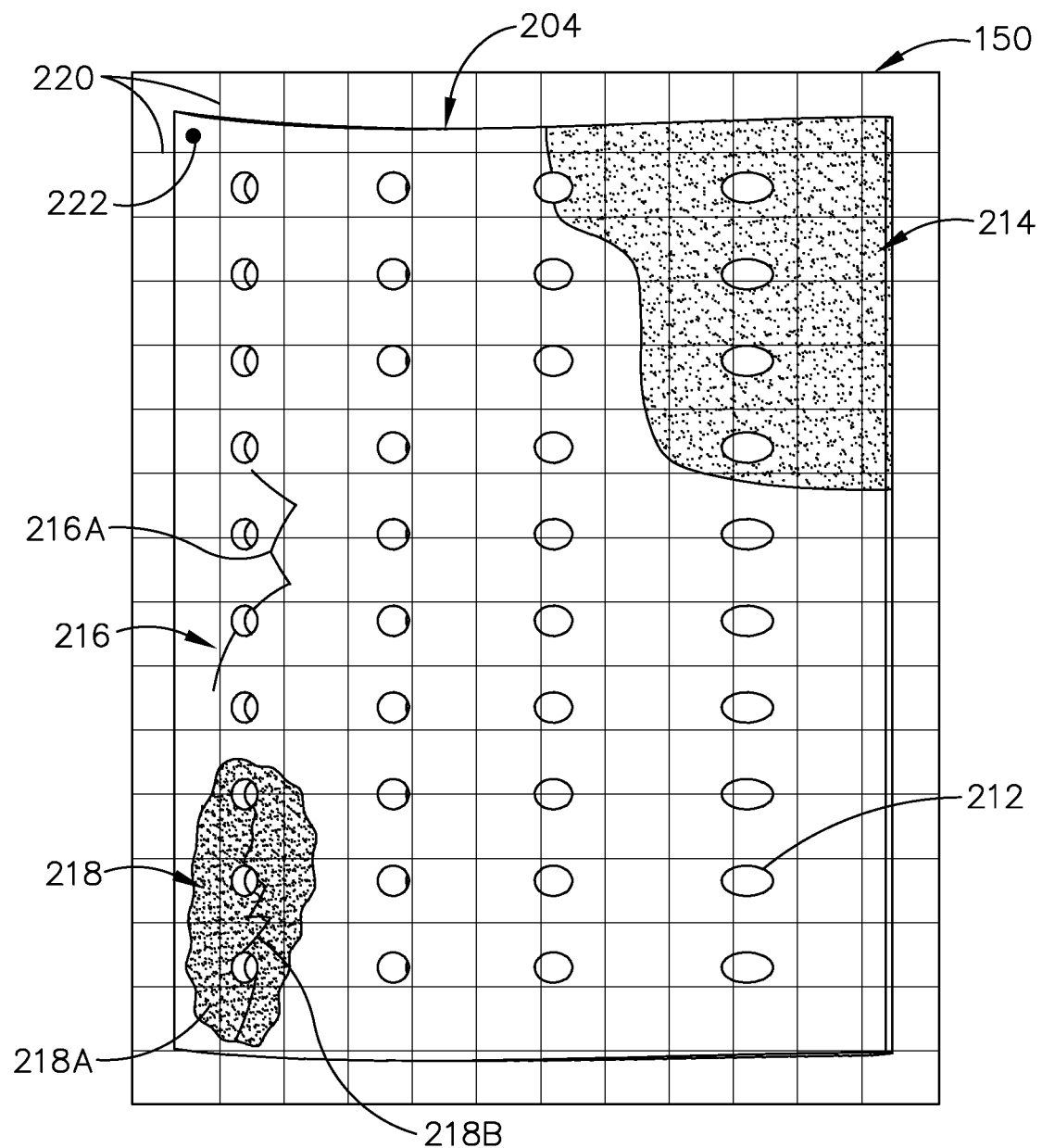
FIG. 3 illustrates a two dimensional image obtained from an imaging assembly of FIG. 2.

FIG. 3 illustrates the video image 150 obtained from the borescope 100 as a two dimensional image. By way of non-limiting example, the video image 150 in FIG. 3 is a two dimensional image of a portion of the airfoil blade 204.

Cooling holes 212 are illustrated in various locations as a non-limiting example and can be found in any shape, location, or number on the airfoil blade 204. By way of non-limiting example, a first identified region 214 can illustrate a region of coating loss and a second identified region 216 can illustrate a crack 216A. By way of non-limiting example, the region of coating loss can be a region of thermal barrier coating loss. Additionally or alternatively, the first identified region 214 can be a region of environmental barrier coating loss, or any other known coating applied to an object.

A third identified region 218, by way of non-limiting example, can illustrate both a region of thermal barrier coating loss 218A and a crack 218B. It is contemplated that the video image 150 can have any integer number of identified regions; including zero regions.

A mapping grid 220 is illustrated by way of non-limiting example, as dotted horizontal and vertical lines across the video image 150. It is further considered that the mapping grid 220 can be of any dimension; including a scale that would consider each pixel of the video image 150. It is also considered that the mapping grid 220 can be any symmetric, asymmetric, or irregular shape.

The controller 160 can include or communicate with software or executable instructions that can translate three dimensional models to two dimensional images. Additionally or alternatively the controller 160 can also include or communicate with software or executable instructions that can translate two dimensional images into three dimensional models.

At least one reference point 222 can be included in the video image 150. By way of non-limiting example, the at least one reference point 222 can be used by the controller 160 to provide the mapping grid 220. Additionally or alternatively, the at least one reference point 222 can be used by the controller 160 to translate the two dimensional image to the three dimensional model or translate the three dimensional model to the two dimensional image.

It is also contemplated that the at least one reference point 222 can be used to align or calibrate images or models, identify a location, or contribute to a measurement of distance, area, or thickness of a region of coating loss or any cracks.

Figure 4:
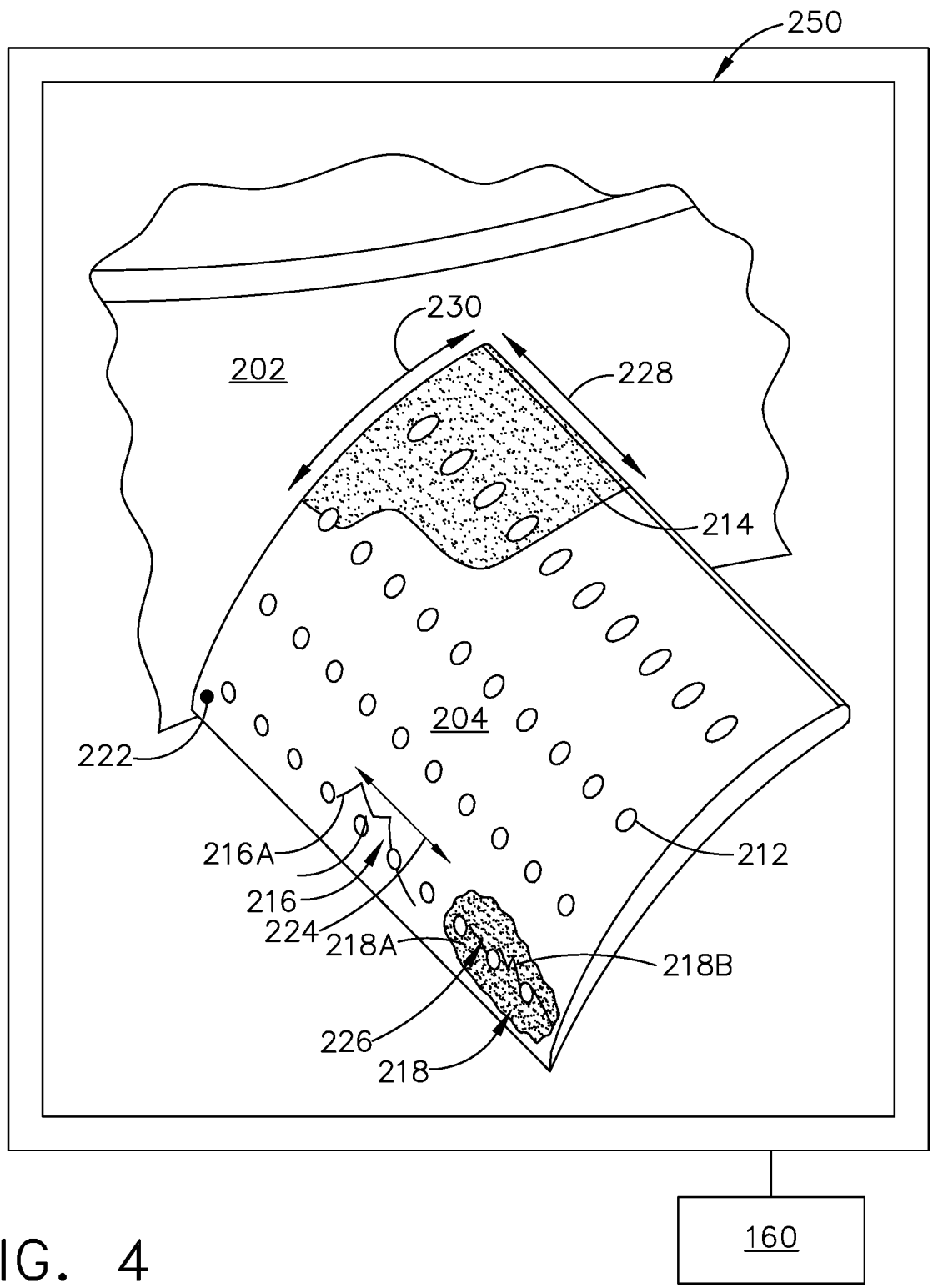
FIG. 4 illustrates a three dimensional model based at least in part on the two dimensional image of FIG. 3.

FIG. 4 is a non-limiting example of a three dimensional model 250 based at least in part from the video image 150. By way of non-limiting example, the three dimensional model 250 can be developed when the controller 160 or a user identifies the object or objects in the video image 150. The controller 160 can load the mapping grid 220 that corresponds to the identified object or objects. The mapping grid 220 can be properly aligned over the video image 150 using the at least one reference point 222. Information can be transferred from the video image 150 to the three dimensional model using the mapping grid 220 and the at least one reference point 222.

The three dimensional model 250 can provide at least one dimension of a coating loss, a crack in the object, or number of cooling holes. The distressed region can be any single location, two dimensional area, or three dimensional space in which coating loss or any cracks have been identified by the color detection capability 168 or another detection device.

The three dimensional model 250 can be, by way of non-limiting example, a CAD file that can illustrate the location and dimensions of the first, second, or third identified regions 214, 216, or 218.

It is contemplated that any software or hardware that can transfer two dimensional images to three dimensional models can be used to develop the three dimensional model 250 from the video image 150.

A crack length 224 illustrates, by way of non-limiting example, a one dimensional measurement of the crack 216A in the second identified region 216. The crack 216A can be identified by the color detection capability 168 of the detection module 164 in the video image 150 (FIG. 3). The mapping grid 220 can be applied to the video image 150 using the at least one reference point 222. The mapping grid 220 can then communicate to the controller 160 that can use software or executable instructions to translate the mapping grid 220 input to the three dimensional model 250. The three dimensional model can provide a length of the crack length 224. The crack length 224 can be measured as the length of a relatively linear line connecting one end of the crack to another end. Alternatively, the crack length 224 can be a number of pixels detected in the image as a part of the crack. It is also contemplated that, the crack length 224 can be the length of a non-linear line that follows the contours of the crack from one end to the other Alternatively, it is contemplated that the length of the crack can be calculated using known methods such as, but not limited to, determining the crack length using a multi-dimensional method that follows the shape or perimeter of the crack.

It is further contemplated that the three dimensional model 250 can indicate a surface area 226 of the crack in the second identified region 216. Additionally, or alternatively, by way of non-limiting example, the three dimensional model 250 can indicate a length 230 and a width 228 of the identified surface coating loss of the first identified region 214, where the length 230 can be the measurement of the most extended dimension and the width 228 can be orthogonal to the length representing the greatest extension in a second dimension Alternatively, area can be measured as a number of pixels, or calculated using other known area dimensional estimating techniques.

Figure 5:
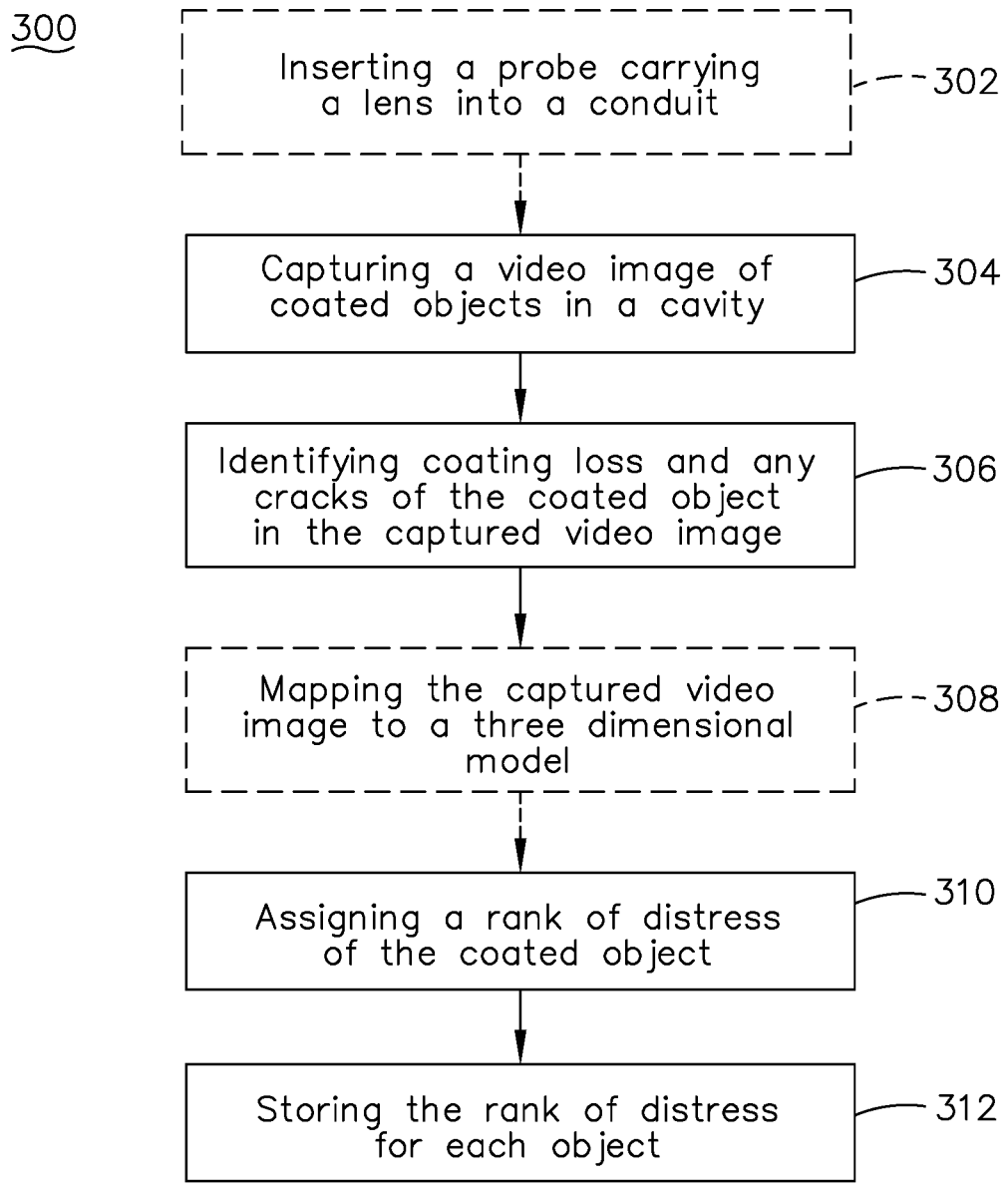
FIG. 5 illustrates a method for inspecting objects in the turbine engine.

FIG. 5 illustrates a method 300 for inspecting a coated object contained within a cavity. The cavity can be any structural or manufactured channel or gap that can be defined by a housing, components, or other structures that can contain or restrict the line of sight to the coated object. The cavity can be coupled to the conduit 126. Optionally, at 302, the imaging device or the borescope 100 can be moved or threaded through a dedicated unlit, closed conduit 126, an air flow channel, or any other suitable conduit. The borescope 100 is a non-limiting example of an imaging assembly or probe carrying a lens. The borescope 100 can continue to move through the closed conduit 126, the air flow channel, or the any other suitable conduit until it is located in or near the cavity containing the coated object to be imaged.

At 304, the borescope 100 can capture the video image 150 of the coated object in the cavity coupled to the conduit 126. The video image 150 from the borescope can be communicated to the detection module 164 of the controller 160. The detection module 164 is configured to identify coating loss and any cracks of the coated object in the video image 150 at 306. The detection module 164 can include at least the color detection capability 168. The color detection capability 168 identifies at least coating loss or any cracks on one or more coated objects of the turbine engine 10. The color detection capability 168 can be based on grouping similar pixels. Pixels can be considered similar and therefore grouped based on at least one of pixel color or location.

By way of non-limiting example, the color detection capability 168 can identify the first identified region 214 and the region of thermal barrier coating loss 218A as regions of coating loss or regions of distress by a coating algorithm. The coating algorithm can use, by way of non-limiting example, a selected range of colors that represent coating loss to detect pixels from the video image 150 that fall within the selected color range. The video image 150 can be color segmented, so that grouping of similar pixels results in an irregular shape (or "Blob") that can represent a region of coating loss. A filter in the coating algorithm discards irregular shapes below a predetermined area threshold and removes segmented noise. The pixels of the identified regions of coating loss, illustrated by way of non-limiting example as the first identified region 214 and the region of thermal barrier coating loss 218A, are marked.

By way of non-limiting example, the color detection capability 168 can identify the second identified region 216 and the crack 218B by a crack algorithm. The crack algorithm can convert the video image 150 to a grey scale where the intensity is checked and increased. The video image 150 is then looped through a thresholding process and inverted. A filter in the in the crack algorithm can eliminate noise, by way of non-limiting example, by checking linearity or aspect ratio. Optionally, the filter can also eliminate noise based on distance between detected pixels. The pixels of the identified regions of cracks, illustrated by way of non-limiting example as the second identified region 216 and the crack 218B, are marked.

The analysis module 166 can be configured to measure the length of the crack identified in the object. Additionally or alternatively, the analysis module 166 can be configured to measure the surface area of the identified crack in the object. Additionally or alternatively the analysis module 166 can be configured to measure the length and width of the identified coating loss.

Optionally, at 310, the captured video image 150 can be mapped to the three dimensional model 250 using the analysis module 166. By way of non-limiting example, the mapping process begins with a digital three dimensional model recalled from the controller memory 162. The at least one reference point 222 can be used to match the orientation of the video image 150 and the digital three dimensional model. A map, illustrated by way of non-limiting example as the mapping grid 220, is developed from the digital three dimensional model and applied to the video image 150 (FIG. 3). Pixels or regions marked on the video image 150 are obtained by the mapping grid 220 and communicated to the controller 160, such that the three dimensional model 250 is formed (FIG. 4) illustrating the first, second, or third identified regions 214, 216, or 218.

The three dimensional model 250 can provide at least one dimension of a coating loss, a crack in the object, or number of cooling holes in the distressed region. By way of non-limiting example, the three dimensional model 250 produced by the analysis module 166 can provide a measurement of the crack length 224 or the surface area 226 of the crack in the second identified region 216. Additionally or alternatively, by way of non-limiting example, the three dimensional model 250 produced by the analysis module 166 can provide a measurement of the length 230 and the width 228 of the coating loss in the first identified region 214. The crack length 224, or the surface area 226, or the length 230 or the width 228 can be measured as a linear measurement, curvilinear, or any other know method of measurement.

Additionally or alternatively to 310, the analysis module 166 can convert the number of pixels marked in the video image 150 to determine a measurement of at least one dimension of a coating loss, a crack in the object, or number of cooling holes in the distressed region.

It is further contemplated that additional measurements of the first, second, or third identified regions 214, 216, or 218 can also be measured by the analysis module 166.

At 312 the analysis module 166 can assign a rank of distress of the objects captured in the video image 150. The rank of distress can be based on at least one dimension, or preferably two dimensions, of coating loss and cracks in the object in the video image 150. The assignment of the rank of distress at 312 is further discussed in FIG. 6. At 314, the rank of distress for each object in the video image 150 is stored. Additionally, the video image 150 or the three dimensional model 250 can also be saved for each object.

It is contemplated that the cavity can contain more than one coated object to be imaged. It is further contemplated that while the video image captured can contain more than one coated object, the identification of coating loss and any crack and the assignment of the rank of distress is unique to each coated object.

Figure 6:
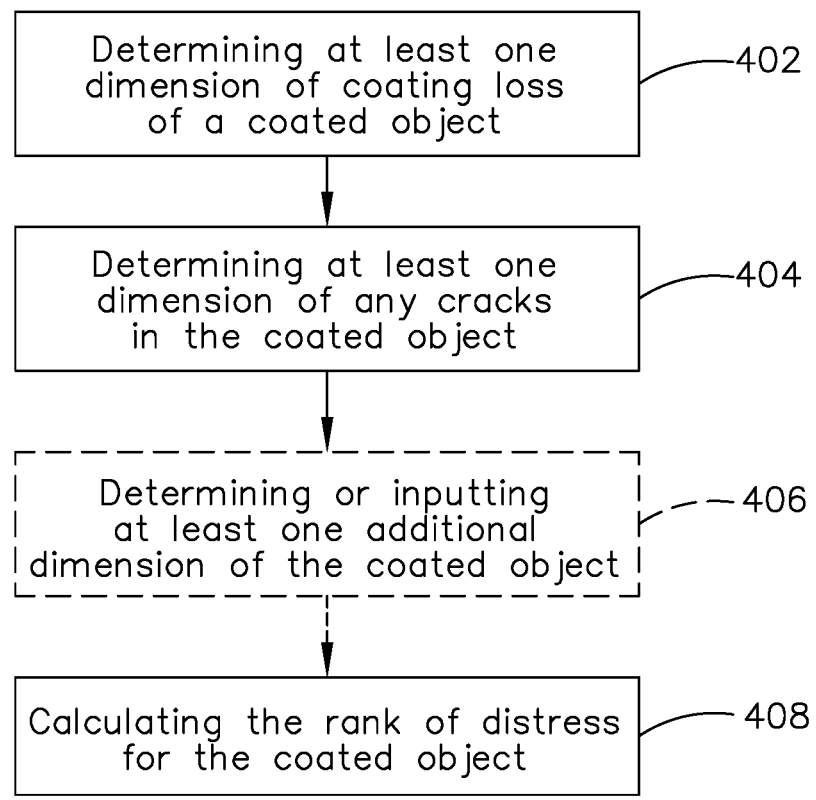
FIG. 6 illustrates a method for assigning a rank of distress to the objects in the turbine engine.

FIG. 6 illustrates a ranking method 400 for assigning a rank of distress to the objects in the turbine engine 10. By way of non-liming example, we will consider the rank of distress of the portion of the airfoil blade 204 illustrated in the video image 150 and three dimensional model 250 (FIG. 3 and FIG. 4).

At 402 at least one dimension of the coating loss for an object is determined. The dimension can be, but is not limited to, an area, length, width, depth, the number of cooling holes in the distressed region or combination therein. The depth can be, but is not limited to, a measurement orthogonal to the surface of an object and extending into the object from the surface of the object to the inner most portion.

For the non-limiting example; let the number of cooling holes in the distressed region impacted by coating loss be the determined dimension at 402. In the first identified region 214; five cooling holes experience some degree of coating loss. Additionally, in the third identified region 218, three more cooling holes experience coating loss. Therefore, the portion of the airfoil blade 204 illustrated in the video image 150 and three dimensional model 250 (FIG. 3 and FIG. 4) has a determined dimension of eight cooling holes that experience some degree of coating loss.

It is further contemplated that the one or more dimensions, measurements, or properties can be considered and combined to produce the one or more dimensions of coating loss determined at 402. Additionally, there can be a mathematical weight or other known method of combining numbers assigned to dimensions, measurements, or aspects considered when determining dimension. Measurements or aspects that can be considered in the determination of the at least one dimension can include, but are not limited to, percent of an object that experiences coating loss, the distance between regions of coating loss, or the location of coating loss.

At 404 at least one dimension of any cracks is determined. The dimension can be, but is not limited to an area, length, width, depth, the number of cooling holes in the distressed region or combination therein. For the non-limiting example, we will consider the length of any cracks as determined by the three dimensional model 250. In the second identified region 216; consider the crack length 224 of the crack 216A to be 2.00 inches. Additionally, in the third identified region 218, consider the crack 218B to have a length 2.25 inches. The portion of the airfoil blade 204 illustrated in the video image 150 and three dimensional model 250 (FIG. 3 and FIG. 4) illustrates a total of length 4.25 inches of cracking.

Optionally at 406, additional dimensions of the object or objects can be determined or input by a user or recalled by the controller 160. Additional dimensions can include, but are not limited to, one or more of a location of previous repair or replacement, age of the one or more objects, or trend data gathered from similar objects.

At 408 the rank of distress is calculated by combining the at least one dimension of the coating loss and the at least one dimension of any cracks by any known method. Optionally, the rank of distress is calculated by combining the at least one dimension of the coating loss, the at least one dimension of any cracks, and any additional dimensions using any known method.

By way of non-limiting example, let the dimension of eight cooling holes experiencing thermal barrier coating loss correspond to a rank of 3 and the dimension of 4.25 inches of cracking correspond to a rank of 7. The combination of 3 and 7 can be 10, resulting in a rank of distress of 10.

Alternatively, the combination of rank 3 and rank 7 can result in a rank of distress of 17 if the dimensional rank of cracking weighed as double.

Another non-limiting example of assigning the rank of distress can be if the airfoil blade 204 in the video image 150 only had the first identified region 214. At 402, the determined dimension can indicate that five cooling holes are effected by thermal barrier coating loss. At 404, the determined dimension can indicate cracking in the blade that is zero inches. When combined at 408, the five cooling holes are effected by thermal barrier coating loss can correspond to a rank of 2 while the zero inches of cracking can correspond to a rank of zero. The combined ranks based on the dimensions determined at 402 and 404 can result in a rank of distress of 2.

Yet another non-limiting example of assigning the rank of distress can be if the airfoil blade 204 in the video image 150 only had the second identified region 216. At 402, the determined dimension can indicate that zero cooling holes are effected by thermal barrier coating loss. At 404, the determined dimension can indicate cracking in the blade that is two inches. When combined at 408, the zero cooling holes effected by thermal barrier coating loss can correspond to a rank of 0 while the two inches of cracking can correspond to a rank of 3. The combined ranks based on the dimensions determined at 402 and 404 can result in a rank of distress of 3.

Still yet another non-limiting example of assigning the rank of distress can be if the airfoil blade 204 in the video image 150 only had the third identified region 218. At 402, the first dimension can indicate that three cooling holes are effected by thermal barrier coating loss. At 404, the determined dimension can indicate cracking in the blade that is 2.25 inches. When combined at 408, the three cooling holes are effected by thermal barrier coating loss can correspond to a rank of 2 while the 2.75 inches of cracking can correspond to a rank of 4. The combined ranks based on the dimensions determined at 402 and 404 can result in a rank of distress of 6.

It is also contemplated that if the airfoil blade 204 does not have any identified regions of thermal barrier coating loss and contains no cracks, the rank of distress is zero.

One benefit of the present disclosure is that the rank of distress can help determine whether one or more objects in the turbine engine 10 need repair or replacement without a user having to analyze the video image.

Another benefit of the present disclosure is the three dimensional model produced by mapping the captured video image onto a digitally stored three dimensional model (such as CAD) that can be developed and saved with the rank of distress. This allows a user to know exactly what part of an object contains coating loss or cracks. This also allows the user to measure a variety of aspects of identified regions.

Yet another advantage is the data obtained for each part of the turbine engine. The data of a specific turbine engine can be saved and used to monitor parts of the turbine engine.

The stored data pertaining to the rank of distress and the video image or the three dimensional model could also be used to study materials used in turbine engines. A prediction of needed repair or a timeline of coating loss or expanding cracks can be established.

It should be understood that application of the disclosed design is not limited to turbine engines with fan and booster sections, but is applicable to turbojets and turboshaft engines as well.

To the extent not already described, the different features and structures of the various embodiments can be used in combination, or in substitution with each other as desired. That one feature is not illustrated in all of the embodiments is not meant to be construed that it cannot be so illustrated, but is done for brevity of description. Thus, the various features of the different embodiments can be mixed and matched as desired to form new embodiments, whether or not the new embodiments are expressly described. All combinations or permutations of features described herein are covered by this disclosure.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A system for inspecting an object comprising:
    an imaging assembly for obtaining a two dimensional video image of an exterior of the object having a coating;
    a detection module configured to identify at least an identification of coating loss and any cracks in the object in the two dimensional video image;
    an analysis module configured to translate the two dimensional video image into a three dimensional model and assign at least a rank of distress, which is indicative of the degree of distress, of the object based on the three dimensional model translated from the identification of the coating loss and any cracks in the objects in the two dimensional video image; and
    a memory for storing at least the rank of distress for each object in the two dimensional video image.

2. The system of claim 1 wherein the object is a component of a turbine engine.

3. The system of claim 1 wherein the imaging assembly includes a borescope for obtaining the two dimensional video image within an unlit, closed conduit, the borescope comprising an elongated probe having a lens located at a first end of the elongated probe within the closed conduit; an artificial light source illuminating a space proximate the lens within the closed conduit; and an imaging device in data communication with the lens converting light from the lens into the two dimensional video image of the object.

4. The system of claim 1 wherein the coating can be one of a thermal barrier coating or an environmental coating.

5. The system of claim 1 wherein the detection module further comprises at least color detection capability.

6. The system of claim 5 wherein the color detection capability is based on a grouping of similar pixels.

7. The system of claim 6 wherein the grouping of similar pixels is based on at least one of pixel color or location.

8. The system of claim 1 wherein the analysis module is configured to measure a length of any cracks identified in the object.

9. The system of claim 1 wherein the analysis module is configured to measure a surface area of any identified cracks in the object.

10. The system of claim 1 wherein the analysis module is configured to measure a length and a width of the identified coating loss.

11. The system of claim 1 wherein the rank of distress is based on at least two dimensions of a coating loss, any cracks in the object, or number of cooling holes in a distressed region.

12. The system of claim 11 wherein at least one dimension of the at least two dimensions is one of an area, length, width, depth, or the number of cooling holes in the distressed region.

13. A system for inspecting engine components of a turbine engine, the system comprising:
    at least one turbine engine component having a coated surface;
    an imaging assembly for obtaining a two dimensional video image of an exterior of the coated surface of the at least one turbine engine component;
    a detection module configured to identify at least an identification of coating loss and any cracks in the at least one turbine engine component in the two dimensional video image;
    an analysis module configured to translate the two dimensional video image into a three dimensional model and assign at least a rank of distress, which is indicative of the degree of distress, of the at least one turbine engine component based on the three dimensional model translated from the identification of the coating loss and any cracks in the at least one turbine engine component in the two dimensional video image; and
    a memory for storing at least the rank of distress for the at least one turbine engine component in the two dimensional video image.

14. The system of claim 13 wherein the imaging assembly includes a borescope for obtaining the two dimensional video image within an unlit, closed conduit, the borescope comprising an elongated probe having a lens located at a first end of the elongated probe within the closed conduit; an artificial light source illuminating a space proximate the lens within the closed conduit; and an imaging device in data communication with the lens converting light from the lens into the two dimensional video image of the at least one turbine engine component.

15. The system of claim 13 wherein the coating can be one of a thermal barrier coating or an environmental coating.

16. The system of claim 13 wherein the rank of distress is based on at least two dimensions of a coating loss, any cracks in the at least one turbine engine component, or number of cooling holes in a distressed region.

17. The system of claim 13 wherein the at least one turbine engine component comprises at least one of a blade, a vane, a shroud, or a combustor.

18. A method for inspecting a coated object contained within a cavity, the method comprising:
capturing a two dimensional video image of an exterior of the coated object in the cavity;
identifying coating loss and any cracks of the coated object in the captured two dimensional video image;
assigning a rank of distress, which is indicative of the degree of distress, of the coated object based on a three dimensional model translated from the identified coating loss and any cracks in the two dimensional video image; and
storing the rank of distress for coated in the two dimensional video image.

19. The method of claim 18 wherein the capturing of the two dimensional video image further comprises inserting a probe carrying a lens into a conduit.

20. The method of claim 18 wherein the identifying coating loss and any cracks of the one coated object in the captured two dimensional video image further comprises color detection capability.

21. The method of claim 20 wherein the color detection capability uses at least one of pixel color or location to group similar pixels.

22. The method of claim 18 wherein the three dimensional model provides at least two dimensions of the coating loss, any cracks in the coated object, or number of cooling holes in a distressed region.

23. The method of claim 18 further comprising assigning the rank of distress based on at least two dimensions of a coating loss, any cracks in the coated object, or number of cooling holes in a distressed region.

* * * * *